US011408796B2

United States Patent
Huss

(10) Patent No.: US 11,408,796 B2
(45) Date of Patent: Aug. 9, 2022

(54) CONTINUOUS MONITORING DEVICE FOR DETECTING DEFECTS IN A SECTION OF PIPING AND A MONITORING SYSTEM FITTED WITH AT LEAST TWO MONITORING DEVICES

(71) Applicant: SPADE, Neuilly-sur-Seine (FR)

(72) Inventor: Gérard Huss, Epernon (FR)

(73) Assignee: SPADE, Neuily-sur-Seine (FR)

( * ) Notice: Subject to any disclaimer, the term of this patent is extended or adjusted under 35 U.S.C. 154(b) by 258 days.

(21) Appl. No.: 16/644,549

(22) PCT Filed: Sep. 18, 2018

(86) PCT No.: PCT/IB2018/057136
§ 371 (c)(1),
(2) Date: Mar. 5, 2020

(87) PCT Pub. No.: WO2019/069161
PCT Pub. Date: Apr. 11, 2019

(65) Prior Publication Data
US 2020/0264070 A1    Aug. 20, 2020

(30) Foreign Application Priority Data

Oct. 5, 2017 (FR) ...................... 17/71055

(51) Int. Cl.
*G01N 27/00* (2006.01)
*G01M 3/40* (2006.01)
(Continued)

(52) U.S. Cl.
CPC .......... *G01M 3/40* (2013.01); *G01N 27/4161* (2013.01); *G01R 27/08* (2013.01)

(58) Field of Classification Search
CPC ..... G01M 3/40; G01N 27/4161; G01N 27/00; G01R 27/08
(Continued)

(56) References Cited

U.S. PATENT DOCUMENTS 5,828,219 A    10/1998 Hanlon et al.
2004/0112737 A1*   6/2004 Benham ............... C23F 13/04
                                                    204/196.21
(Continued)

FOREIGN PATENT DOCUMENTS

EP    0 560 443 A1    9/1993
JP    2014-084490 A   5/2014

OTHER PUBLICATIONS

International Search Report dated Dec. 14, 2018 in corresponding PCT International Application No. PCT/IB2018/057136.
(Continued)

*Primary Examiner* — Raul J Rios Russo
(74) *Attorney, Agent, or Firm* — Tutunjian & Bitetto, P.C.

(57) ABSTRACT

A continuous monitoring device for detecting defects in a section of piping and a monitoring system that includes at least two monitoring devices. The monitoring device includes injection means that are capable of generating an electric current at a first end of the section of piping, at least one withdrawal point at the second end of the section of piping, allowing the injected current to be removed via grounding, and a control housing with means for measuring at least one component of the current received by the withdrawal point and analysis means for detecting, on the basis of the measurements obtained by the measurement means, a variation in the received component corresponding to a type of defect in the piping.

11 Claims, 1 Drawing Sheet

(51) Int. Cl.
*G01N 27/416* (2006.01)
*G01R 27/08* (2006.01)

(58) Field of Classification Search
USPC .................... 324/323, 347, 354, 357, 376
See application file for complete search history.

(56) References Cited

U.S. PATENT DOCUMENTS

| | | | |
|---|---|---|---|
| 2005/0006250 A1* | 1/2005 | Russell | C23F 13/04 |
| | | | 205/726 |
| 2007/0158184 A1* | 7/2007 | Benham | C23F 13/04 |
| | | | 204/196.01 |
| 2010/0213955 A1 | 8/2010 | Herraez et al. | |
| 2013/0036800 A1* | 2/2013 | Mohajer | F17D 3/12 |
| | | | 73/61.59 |
| 2014/0316723 A1* | 10/2014 | Rogers | G01M 3/2892 |
| | | | 702/55 |
| 2016/0214852 A1* | 7/2016 | Collins | G01M 3/2815 |

OTHER PUBLICATIONS

Written Opinion dated Dec. 14, 2018 in corresponding PCT International Application No. PCT/IB2018/057136.
Search Report dated May 28, 2018 in corresponding French Patent Application No. 1771055.

* cited by examiner

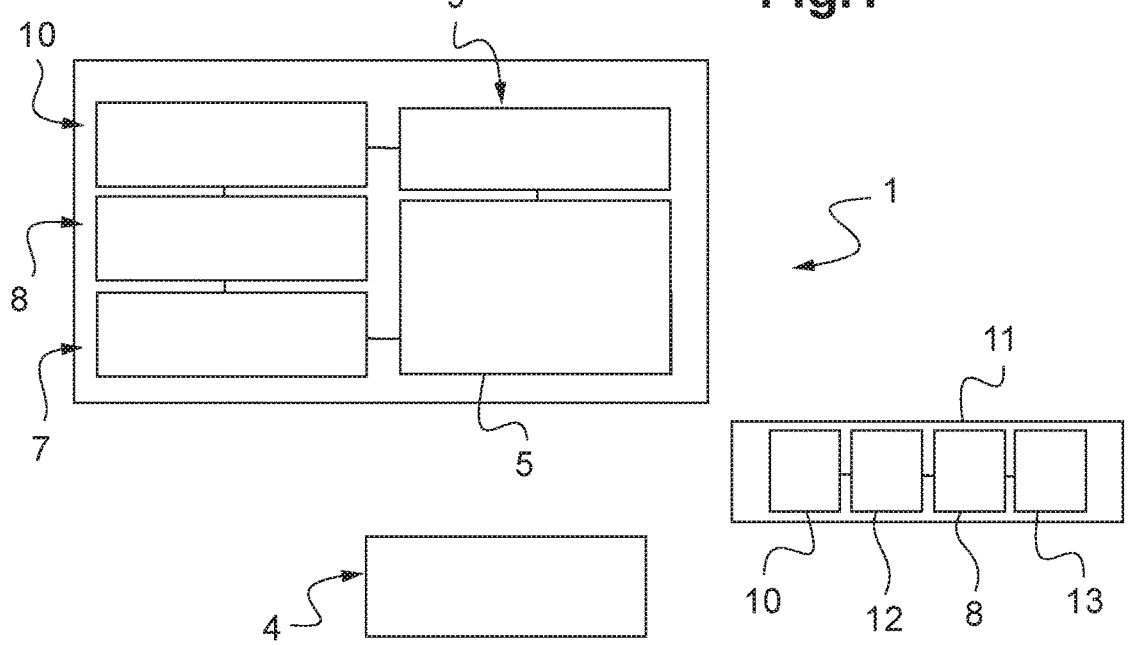
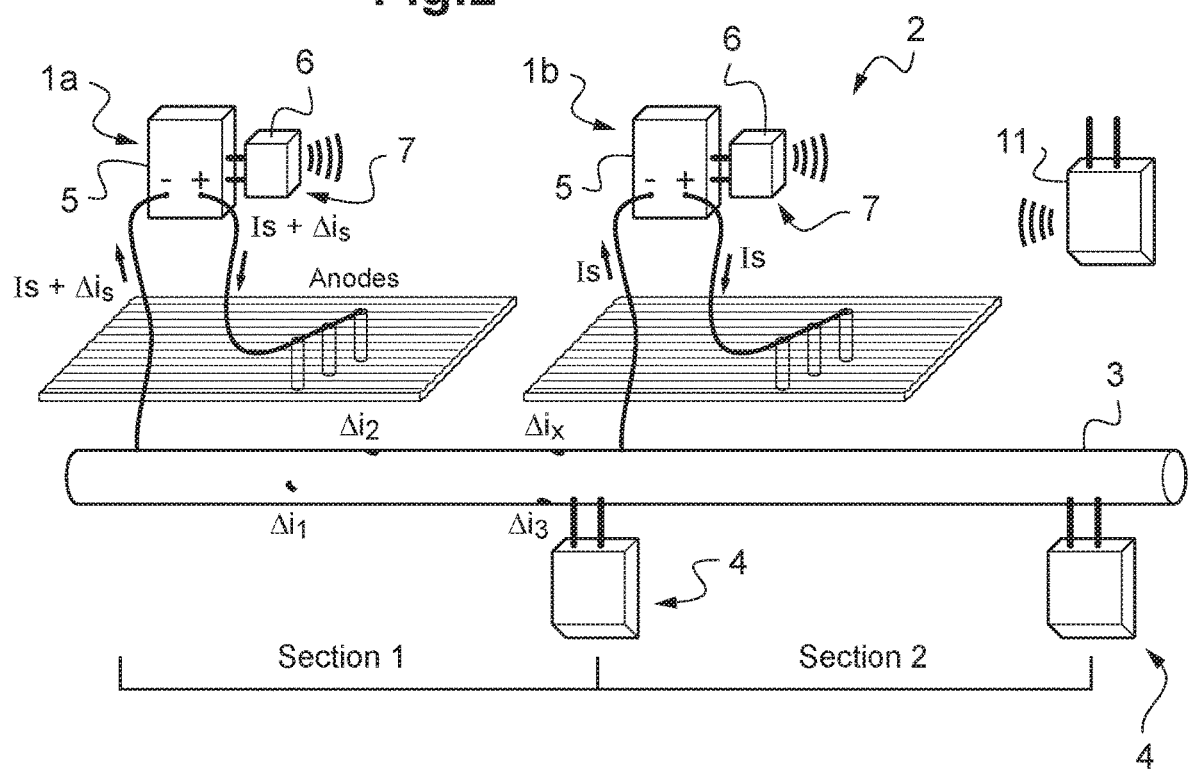

CONTINUOUS MONITORING DEVICE FOR DETECTING DEFECTS IN A SECTION OF PIPING AND A MONITORING SYSTEM FITTED WITH AT LEAST TWO MONITORING DEVICES

CROSS-REFERENCE TO RELATED APPLICATIONS

The present application is a 35 U.S.C. §§ 371 national phase conversion of PCT International Application No. PCT/IB2018/057136, filed Sep. 18, 2018, which claims priority to French Patent Application No. 17/71055, filed Oct. 5, 2017, the contents of which are incorporated herein by reference. The PCT International Application was published in the French language.

The present invention relates to a monitoring device for continuously detecting defects in a section of piping and a monitoring system equipped with at least two monitoring devices.

TECHNICAL FIELD

The invention relates to the technical field of monitoring piping including a metallic structure, particularly buried, in order to detect a defect of the piping requiring repair or replacement work.

The invention will be particularly suitable for monitoring pipelines carrying out the transport of gaseous or liquid fluids, such as for example hydrocarbons, on natural or artificial sites.

PRIOR ART

Various means for verifying the condition of a piping are known at the present time.

According to a first control method, the control is carried out via the exterior of the piping, particularly using magnetometers, to this end, operators follow the piping looking for magnetic anomalies corresponding to piping defects. This technique particularly has the advantage of being suitable for being carried out without stopping the operation of the piping.

However, this verification is burdensome to implement and can only be carried out occasionally, it requires moreover considerable time particularly depending on the length of the piping. This control method is however not suitable for deeply buried piping or indeed piping situated in environments that are difficult to access.

According to a second control method, the control of the piping is carried out via the interior, particularly using robots moving in the pipe. This technique is of interest in that it requires little labor and makes it possible to monitor significant lengths of piping.

However, this technique is not suitable for monitoring piping having excessive diameter variations or indeed of small diameters or indeed having sections with significant bends. Moreover, interior control requires stoppage of the operation of the piping and hence cannot be carried out continuously.

SUBJECT MATTER OF THE INVENTION

A first aim of the present invention is that of solving all or part of the technical problems associated with the abovementioned prior art.

A further aim of the present invention is that of providing a monitoring device for continuous monitoring of a section of piping without stopping operation of the piping.

A further aim of the present invention is that of providing a monitoring device suitable for generating an alarm in the event of the detection of damage of the piping.

A further aim of the present invention is that of providing an automatic monitoring device not requiring human intervention in the anomaly detection phase.

A further aim of the present invention is that of providing a monitoring device suitable for distinguishing between regular wear of the piping and another type of damage.

A further aim of the present invention is that of providing a monitoring device suitable for creating a history of the status of each section of piping.

A further aim of the present invention is that of providing a monitoring device suitable for being readily adapted to piping equipped with a cathodic protection device.

SUMMARY OF THE INVENTION

The present invention relates to a monitoring device for continuously detecting defects in a section of piping, according to the invention, the device comprises:

injection means suitable for generating an electric current at a first end of the section of piping, at least one withdrawal point at the second end of the section of piping, suitable for discharging the injected current via grounding, a control housing with means for measuring at least one component of the current received by the withdrawal point and analysis means for detecting, on the basis of the measurements obtained by the measurement means, a variation of the received component corresponding to a type of defect in the piping.

The invention also relates to protecting a monitoring system including at least two monitoring devices as mentioned above.

Definitions

The term "continuous" in the expression continuous monitoring means, according to the present invention, that the monitoring of the section of piping can be carried out without interruption.

The term "piping" denotes in the present invention any type of piping including a metallic conductive layer and particularly pipeline type piping for transporting any gaseous or liquid fluid.

BRIEF DESCRIPTION OF THE FIGURES

The present invention will be understood more clearly on reading a detailed example of an embodiment with reference to the appended figures, provided by way of non-limiting example, wherein:

FIG. 1 represents a schematic example of an embodiment of a device according to the invention, FIG. 2 represents a schematic and perspective view of a monitoring system disposed on two sections of piping to be monitored.

DETAILED DESCRIPTION OF THE INVENTION

With reference to FIG. 1, a monitoring device 1 for continuously detecting defects in a section of piping is represented.

With reference to FIG. 2, a monitoring system 2 including two monitoring devices 1a and 1b, suitable for monitoring the sections S1 and S2 of piping 3, respectively, is represented.

In FIG. 1, it is seen that the monitoring device 1 comprises injection means 4 suitable for generating an electric current at a first end of the section of piping 3.

The device 1 also comprises at least one withdrawal point 5 at the second end of the section of piping. The withdrawal point 5 is suitable for discharging the injected current via grounding. This grounding is carried out by connecting, in a known manner, the withdrawal point 5 to the earth as represented in FIG. 2.

The control device 1 further comprises a control housing 6 associated with the withdrawal point 5. This control housing 6 may be either wired to the withdrawal point 5 upstream or downstream therefrom, as represented in FIG. 2, or disposed in the withdrawal point 5 according to an advantageous alternative embodiment. In the different options, the measurement means 7 include a measurement shunt placed on or in the withdrawal point 5.

The control housing 6 comprises means 7 for measuring at least one component of the current received by the withdrawal point 5. Advantageously, the component measured will be, in the case of direct voltage injection, the current intensity by means of an ammeter or equivalent.

However, further measurements used to carry out the analysis may also be performed and particularly in cases of variable voltage, voltage and intensity measurements suitable for analyzing the signal voltage/intensity ratio variations.

The control housing 6 further includes analysis means 8 suitable for detecting, using the measurements obtained by the measurement means 7, a variation of the received component corresponding to a type of defect in the piping.

The control housing 6 further comprises power supply means 9, these power supply means 9, conventionally embodied with a battery or main wiring, being suitable for being shared or not with those of the withdrawal point 5.

The control housing 6 further comprises transmission means 10 to a central unit 11. These, radiofrequency, transmission means 10 enable data transmission to the central unit 11 advantageously positioned at the control station of the piping network. These transmitted data may consist of the transmission of the measurements made by the measurement means 7 and/or the analysis performed by the analysis means 8.

It is important to highlight indeed that said analysis means 8 are shared between the housing 6 and the central unit 11.

It is also important to highlight that some piping is already equipped with power supply means 4 and at least one withdrawal point 5. These elements 4 and 5 are indeed used to carry out the cathodic protection of the piping in order to protect the metallic layer of the piping from corrosion phenomena.

In this hypothesis, the present monitoring device 1 may advantageously take the elements 4 and 5 thereof and connect same to the control housing 6 to enable the embodiment of the invention.

In the case of a new installation to be equipped with cathodic protection means, it will be advantageous to provide an end-to-end device incorporating the functions of cathodic protection and of monitoring of the present invention.

The central unit 11 makes it possible to receive the data transmitted by the housing(s) 6 to which it is connected. The central unit 11 comprises alarm means 12 suitable for warning in the event of the discovery of a defect of the section of piping monitored. The alarm means 12, particularly visual or audio, are suitable for indicating advantageously the section having a defect and the type of defect.

The operation of the control device 1 is continuous and does not require labor or indeed stoppage of operation of the piping 3. The monitoring device 1 injects the current continuously, using the injection means 4, and the measurement means 7 measure the variations of the current collected by the withdrawal point 5.

With reference to FIG. 2, there is seen a section S1 exhibiting defects and a section S2 with no defects. The creation of a defect induces an increase in the current detected by the measurement means 7 and originating from the current transmitted by the injection means 4 and advantageously corresponding to the current transmitted for the cathodic protection. This increase is dependent on the type of defect and corresponds to a peak wherein the phase suitable for being analyzed with the most precision lasts about some ten minutes.

Indeed, it is important to note that cathodic protection is an electrochemical process that makes it possible to prevent the corrosion of steel in the soil. Pipelines are steel tubes with a protective and electrically insulating coating but including defects due to delamination, lamination or friction in the soil. Usually, there is an electrochemical equilibrium between the steel and the soil maintained by a cathodic current. When this coating is damaged, the cathodic protection takes over from the steel coating protection.

The appearance of a defect induces a current increase over a very short time, of the order of a few hundredths of seconds then this current decreases with the electrochemical polarization of the steel. The initial current will be dependent on the area of the defect and the electrical conductivity of the surrounding soil (electrical resistance of the defect in the soil).

The current decline or polarization time may be from a few minutes to several hours or even several days according to the polarization current density (ratio of the current to the area of the defect expressed in $mA/m^2$), it may also be dependent on the chemical composition of the soil.

The analysis of the current variation in the few seconds following the initial current peak makes it possible to evaluate the degree of damage of the coating and the risk of impairment of the steel.

In order to detect this phase with certainty, a sampling frequency of the measurement means 7 between 0.01 and 1 Hz is advantageously envisaged.

According to the type of defect, the variation of the component of the current is different, and particularly with respect to the amplitude thereof or the shape of the peak thereof. In other words, it is possible using a database containing the various current variation patterns according to the type of defect to be able to determine the type of defect based on the sole current variation measurements.

To this end, the analysis means 8 include comparison means between the variation in intensity per unit of time in the measurements of the intensity component with a database 13 suitable for linking the variation(s) with a type of defect.

In a basic version, the comparison means include a low threshold enabling sole accounting of the variations of intensity per unit of time greater than the low threshold to prevent false alarms. This threshold particularly makes it possible to prevent false alarms due to a very slight and regular increase due to normal wear of the metallic layer of the piping.

In an advantageous version, the comparison means make it possible to distinguish between the main sources of damage having different variation patterns that is to say particularly damage of the mechanical shock type on the surface of the piping, of the contact type between the sheath and the free tube of the piping, such as lightning-related damage, of the defective insulating coupling type or indeed of the metallic indicator potential measurement-related damage type.

As regards damage following a potential measurement, which is the technique currently used for controlling cathodic protection, there are advantageously provided, at the control device 1 disengaging means. These disengaging means are suitable for carrying out external controls without triggering an alarm associated with said external controls.

To do this, the operator in charge of the external control of a section of piping carries out, prior to the external control, the disengagement of the monitoring device 1 and reengages the latter once the external control has been completed.

The disengaging means may particularly consist of deactivating the alarm means 12 solely for the section of piping in question.

Advantageously, the analysis means 8 include recording means suitable for creating a history of the defects of a section of piping, suitable for monitoring the progression of the section of piping. This feature is of particular interest since it makes it possible to anticipate the piping maintenance work. These recording means are, advantageously, merged with the database 13.

The monitoring device as described in the present application enables the continuous monitoring of a section of piping without stopping the operation of the piping, without human intervention in the defect detection phase. It may further be readily adapted to piping previously equipped with a cathodic protection device.

Obviously, further features of the invention could also have been envisaged without for all that leaving the scope of the invention defined by the claims hereinafter.

By way of example, the monitoring system includes a multitude of monitoring devices suitable for covering all or part of the piping to be monitored as well as the various connection parts provided at the piping or between several items of piping.

The invention claimed is:

1. A monitoring device for continuously detecting defects in a section of piping under cathodic protection, wherein the device comprises:
    injection means suitable for generating a cathodic electric current for cathodic protection at a first end of the section of piping,
    at least one withdrawal point at a second end of the section of piping, suitable for discharging the cathodic electric current via grounding,
    a control housing with means for measuring at least one component of the cathodic electric current received by the withdrawal point and analysis means for detecting, on the basis of the measurements obtained by the measurement means, a variation of the received component corresponding to a type of defect in the piping.

2. The monitoring device according to claim 1, wherein the control housing includes radiofrequency transmission means to a central unit of the measurements made by the measurement means and/or the analysis performed by the analysis means, said analysis means being distributed between the control housing and the central unit.

3. The monitoring device according to claim 2, wherein the central unit comprises alarm means suitable for warning in the event of detection of a defect of the section of piping monitored.

4. The monitoring device according to claim 1, wherein the measurement means include a measurement shunt placed on or in the withdrawal point.

5. The monitoring device according to claim 1, wherein a sampling frequency of the measurement means is between 0.01 and 1 Hz.

6. The monitoring device according to claim 1, wherein the analysis means include comparison means between the variation in intensity per unit of time in the measurements of the intensity component with a database suitable for linking the variation(s) with a type of defect.

7. The monitoring device according to claim 6, wherein the comparison means include a low threshold enabling sole accounting of the variations of intensity per unit of time greater than the low threshold to prevent false alarms.

8. The monitoring device according to claim 1, further comprising disengaging means suitable for carrying out external controls without triggering an alarm associated with said external controls.

9. The monitoring device according to claim 1, wherein the control housing is integrated in the withdrawal point.

10. The monitoring device according to claim 1, wherein the analysis means include recording means and a database suitable for creating a history of the defects of a section of piping.

11. The monitoring system including at least two monitoring devices according to claim 1 and a central unit suitable for monitoring a plurality of sections of piping.

* * * * *